US006469580B2

(12) United States Patent
Sanduleanu

(10) Patent No.: US 6,469,580 B2
(45) Date of Patent: Oct. 22, 2002

(54) FULLY DIFFERENTIAL, VARIABLE-GAIN AMPLIFIER AND A MULTIDIMENSIONAL AMPLIFIER ARRANGEMENT

(75) Inventor: Mihai Adrian Tiberiu Sanduleanu, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/042,445

(22) Filed: Jan. 8, 2002

(65) Prior Publication Data

US 2002/0109546 A1 Aug. 15, 2002

(30) Foreign Application Priority Data

Jan. 10, 2001 (EP) .............................. 01200064

(51) Int. Cl.[7] ................................. H03F 3/45

(52) U.S. Cl. ......................... 330/254; 330/69

(58) Field of Search ............................ 330/69, 254, 82, 330/83, 311

(56) References Cited

U.S. PATENT DOCUMENTS

| 3,919,654 | A | * | 11/1975 | Toumani | ...................... 330/29 |
| 5,581,212 | A | | 12/1996 | Huang et al. | ................ 330/253 |
| 6,127,890 | A | * | 10/2000 | Shimomura et al. | ......... 330/254 |
| 6,300,832 | B1 | * | 10/2001 | Okazaki | ..................... 330/254 |

* cited by examiner

*Primary Examiner*—Benny Lee
*Assistant Examiner*—Henry Choe
(74) *Attorney, Agent, or Firm*—Steven R. Biren

(57) ABSTRACT

A fully differential, variable gain amplifier comprising an input, an intermediate stage and an output stage, the input stage (100) being coupled to the intermediate stage (200) and the intermediate stage being coupled to the output stage (300). The input stage comprises an amplifier with local feedback means and voltage-to-current conversion means. The intermediate stage has nodes that are shared by the input stage, the output stage and the intermediate stage, respectively, which are connected to the reference node via a relatively low impedance branch. The intermediate stage further comprises current controlled networks coupled to the common nodes via a first feedback branches and branches to the input stage via second feedback branches. The amplifier has means for controlling the gain and the bandwidth independently of one another.

13 Claims, 4 Drawing Sheets

FULLY DIFFERENTIAL, VARIABLE-GAIN AMPLIFIER AND A MULTIDIMENSIONAL AMPLIFIER ARRANGEMENT

BACKGROUND OF THE INVENTION

The present invention relates to a fully differential, variable gain amplifier comprising an input, an intermediate stage and an output stage, and voltage to current conversion means, the input stage being coupled to the intermediate stage and the intermediate stage being coupled to the output stage.

Wide band amplifiers are very useful devices in applications where stable and predictable parameters, gain among them, are required over a maximal bandwidth.

These applications include optical fiber transmitters and receivers, input amplifiers for amplifying the output signals in a read head of an optical player and many other applications.

These applications usually trans employ impedance Amplifiers (TIA). These amplifiers have resistive feedback means. Both the bandwidth and the gain of the TIA depend on the resistive value of these feedback means.

For many purposes, it is desirable to achieve a high gain and a maximal bandwidth. However, these objectives cannot be achieved at the same time with the standard TIA described above.

It is furthermore desirable that the TIA can work with both differential and single-ended signal sources in order to obtain a greater flexibility in applications, without their performance being reduced significantly.

As long as the previously presented approach is maintained, only some aspects of TIA performance can be improved at the expense of very complicated solutions, while it does not provide a gain which is controllable independently of the bandwidth.

An amplifier of the type described in the opening paragraph is disclosed in U.S. Pat. No. 5,581,212. In order to broaden its bandwidth, this amplifier has three stages with a TIA as the final stage. Again, (the operation of) this wide band amplifier cannot provide a gain which is controllable independently of the bandwidth of the amplifier.

SUMMARY OF THE INVENTION

It is therefore an object of the present invention to provide a fully differential, variable gain amplifier and a multidimensional amplifier arrangement with the possibility to controlling the bandwidth and the gain independently of one another.

In accordance with the invention, this object is achieved in a device as described in the introductory paragraph, which is characterized in that the input stage comprises an input differential amplifier having local feedback means and voltage-to-current conversion means, for coupling said input differential amplifier to the intermediate stage, and in that the intermediate stage comprises a first and a second branch from respective common nodes to a reference node, which common nodes are shared by said input stage, output stage and intermediate stage, the intermediate stage further comprising current controlled networks coupled to the common nodes via first feedback branches and to the input stage via second feedback branches. The local feedback means lower the input impedance and raise the cut-off frequency of the input differential amplifier, thereby widening the bandwidth. The second feedback branches further lower the input impedance and at the same time, raise the cut-off frequency of the input differential amplifier. The first and the second branch between the common nodes and the reference node may be implemented as low impedance branches, enabling the impedance of the common node to be reduced. A direct consequence of this is that the time constants associated with the common node decrease and the bandwidth increases. The connection between the output of the input differential amplifier, on which output voltage signals appear and the common nodes includes voltage to current conversion means to adapt said output signals to the low impedance nodes. Said common nodes are shared by the inputs of the output stage, wich reduces the input impedance and expands the bandwidth of this stage. It is clear that the bandwidth of the fully differential, variable gain amplifier, hereafter denoted as "Amplifier", is controlled by means of said local feedback, the first feedback branches and the second feedback branches. Since said output stage is not involved in this system of feedbacks it can control the gain independently of the bandwidth of the Amplifier. This makes the Amplifier according to the invention particularly suitable for wide band applications.

The embodiment of the Amplifier as claimed in claim 2 has the advantage of an increased Common Mode Rejection Ratio (CMRR) with the direct consequence that the overall signal to noise ratio (S/N) is also improved.

Since the positive feedback is embedded in the negative feedback the stability of the Amplifier is improved.

By way of illustration, all the stages described hereinbefore are realized with transistors. In an embodiment all these transistors are implemented in bipolar and CMOS technology.

The low input impedance of the Amplifier according to the invention allows a very simple connection of a current source to its input. This is of particular interest for applications as optical receivers, where the input device is an optical detector. Usually these devices are implemented as a semiconductor photodiode that behaves as a current source.

It is another object of the present invention to provide a multidimensional amplifier arrangement characterized by a first, N1 dimensional array of Voltage Controlled Current Sources (VCCS array), a second, N2 dimensional array of fully differential, variable gain amplifiers (TIA array) as claimed in claim 1, and a Control Unit, said Control Unit being coupled to the VCCS and the TIA arrays.

The VCCS Array provides means to adapt a Voltage Input Vector to the inputs of any TIA in the Array. The Control Unit comprises means for routing the Input vector either to the VCCS Array or to the TIA Array. The Control Unit also comprises means to control either the size of the VCCS Array or the size of the TIA Array.

The above and other features and advantages of the invention will be apparent from the following description of exemplary embodiments of the invention with reference to the accompanying drawings, in which:

DETAILED DESCRIPTION OF THE EMBODIMENTS

Figure 1:
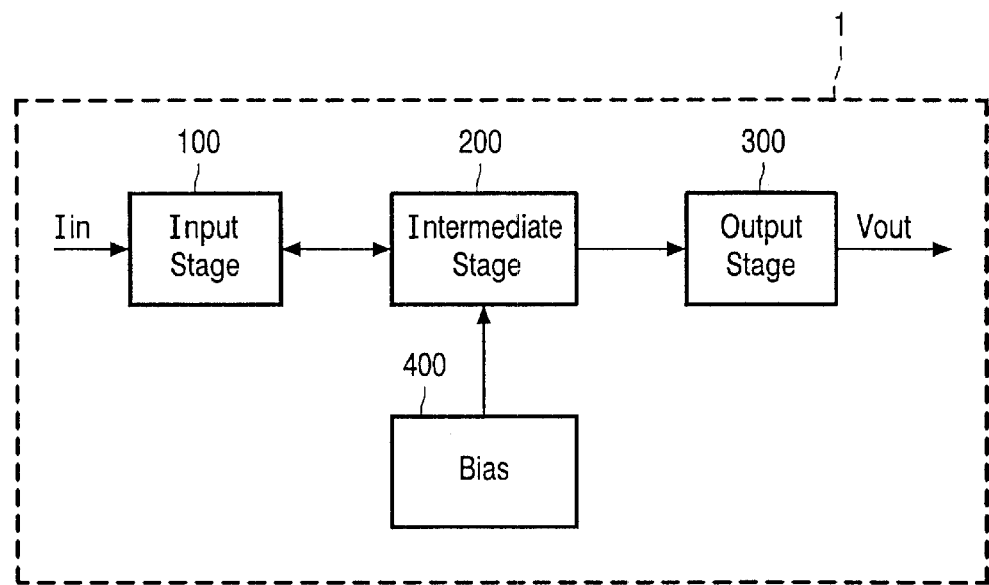
FIG. 1 is a block diagram of an embodiment of an amplifier.

FIG. 1 shows a block diagram of the Amplifier according to the invention. There are three main stages, i.e. an input stage 100, an intermediate stage 200 and an output stage 300. The input stage 100 receives an input signal, labeled Iin, for convenience and, after amplification, transfers it to the intermediate stage 200. The intermediate stage 200 is coupled to the input stage 100 and to the output stage 300. The output stage 300 is coupled to the intermediate stage 200 and provides an output signal Vout.

Furthermore, a bias stage 400 is shown, which serves as a suitable power supply for said input stage 100, intermediate stage 200 and output stage 300.

Figure 2:
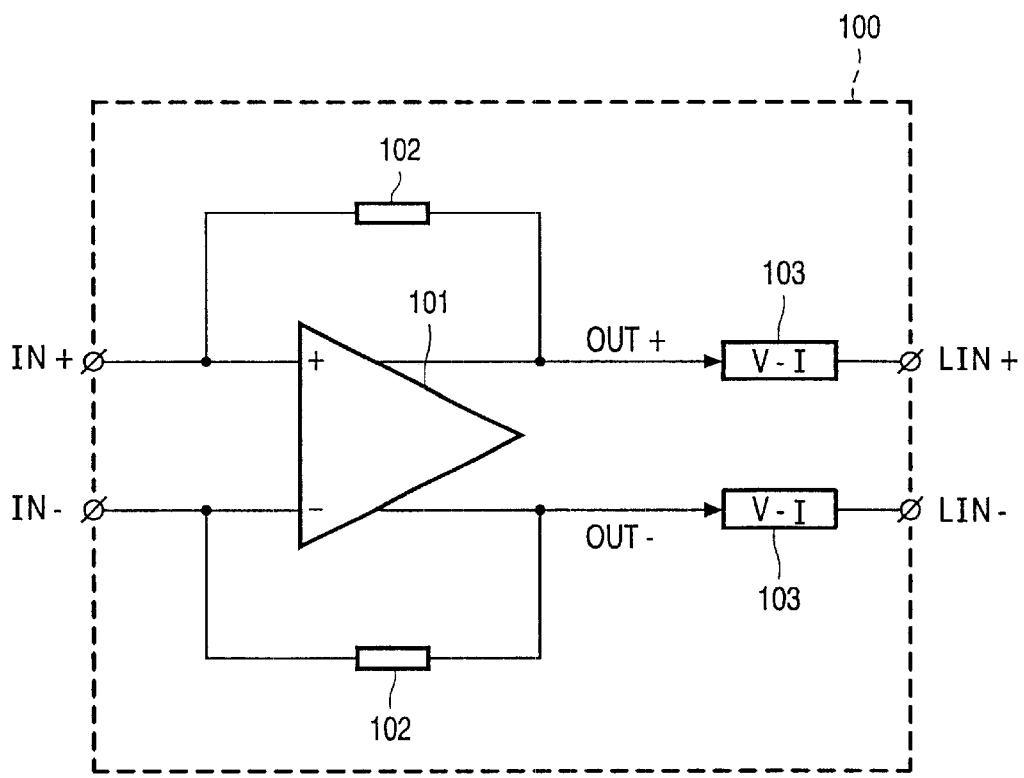
FIG. 2 is a block diagram of the input stage.

FIG. 2 shows the input stage 100 of a type which includes a differential input amplifier realized with a differential current controlled voltage source (CCVS) 101 having its input nodes labeled IN+ and IN− for convenience, having a negative feedback 102 and providing output signals OUT+ and OUT−. These output signals, which are voltages, are coupled to two voltage to current (V-I) converters 103, which supply output signals LIN+ and LIN−. These output signals are currents. The input stage 101 can also be used with a single ended signal source, so that the other input can be used for offset adjustment.

The negative feedback 102 lowers the input impedance of the CCVS 101 and raises it's cut-off frequency, as a result of which the overall bandwidth of the input stage 100 increases.

Since the input nodes of the intermediate stage 200 have a relatively low impedance and because CCVS 101 outputs are voltage signals, two V-I converters 103 have been provided.

Figure 3:
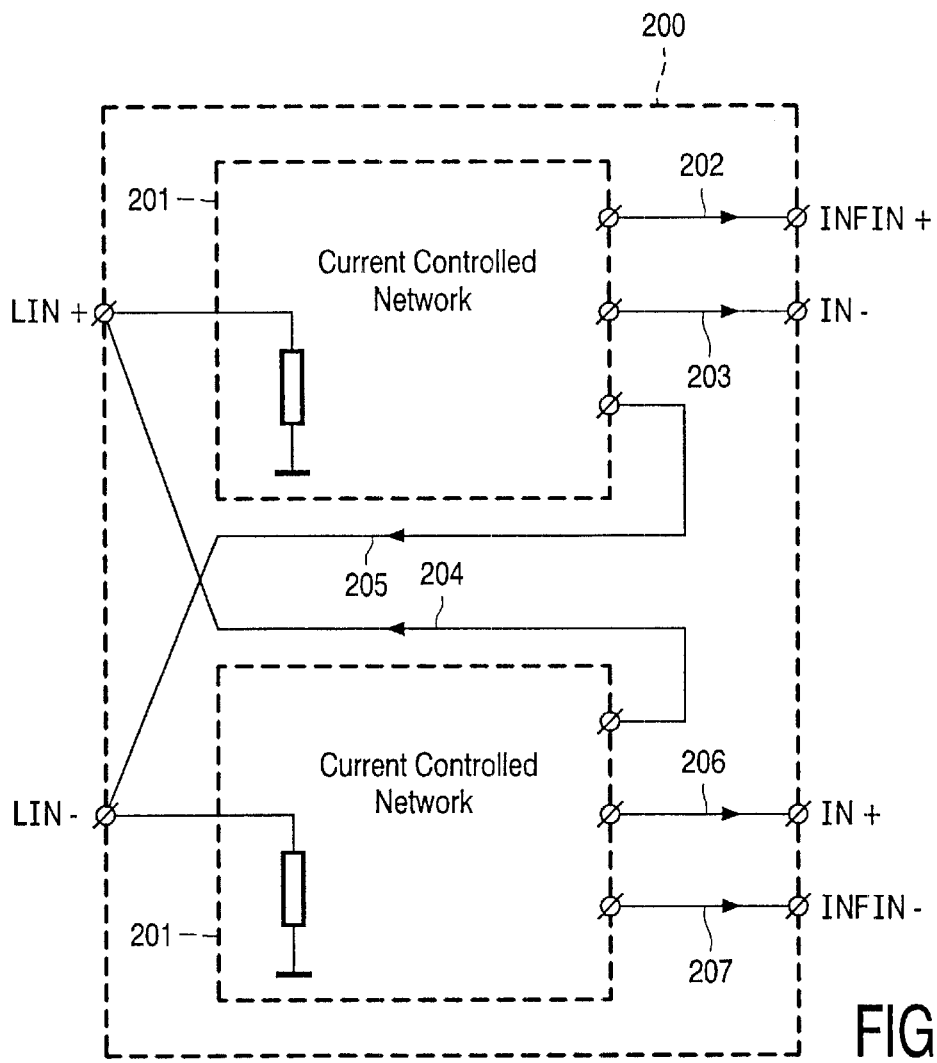
FIG. 3 is a block diagram of the intermediate stage.

FIG. 3 shows an intermediate stage 200. It comprises two Current Controlled Networks (CCN) 201 with feedback connections. The feedback connections 203 and 206 are negative feedback connections from the intermediate stage to the input nodes IN+ and IN− of the input stage 100. The feedback connections 204 and 205 are positive feedback connections to the common nodes LIN+ and LIN−. The connections 202 and 207 couple the intermediate stage 200 to the output stage 300. The input nodes LIN+ and LIN− are coupled to GND via low impedance branches and therefore the nodes LIN+ and LIN− are relatively low impedance nodes.

The role of the CCNs is to provide copies of the currents through said low impedance branches to the feedback connections of the CCNs to the input nodes LIN+ and LIN− of the intermediate stage 200, to the input stage 100 and to the output stage 300. The positive feedback connections 204 and 205 also provide an improvement of the Common Mode Rejection Ratio (CMRR) and, as a consequence, of the signal to noise ratio of the Amplifier. The negative feedback connections 203 and 206 further reduce the input impedance of the input stage 100 and improve the bandwidth.

The low impedance nodes LIN+ and LIN− are shared by said input stage 100, intermediate stage 200 and output stage 300, which reduces the time constants associated with the impedance between these nodes and common node and, as a direct consequence, extends the overall bandwidth of the Amplifier. In fact, the CCNs 201 control the bandwidth of the Amplifier independently with respect of it's gain.

Figure 4:
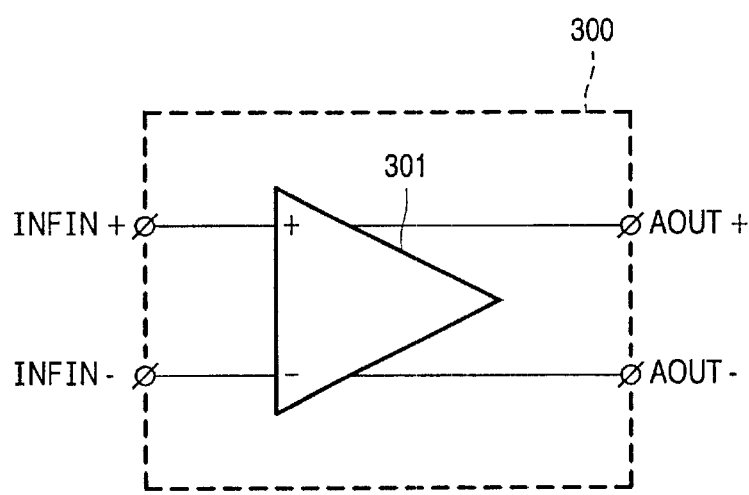
FIG. 4 is a block diagram of the output stage.

FIG. 4 shows an output stage 300. It comprises a fully differential output amplifier 301. The fully differential output amplifier is realized with CCVS and because it shares the low impedances nodes LIN+ and LIN− with the intermediate stage 200 and the input stage 100, it has a large bandwidth. The fully differential output amplifier 300 has means to control the gain independently of the bandwidth of the amplifier. At its outputs it provides a fully differential voltage signal between the nodes AOUT+ and AOUT−.

Figure 5:
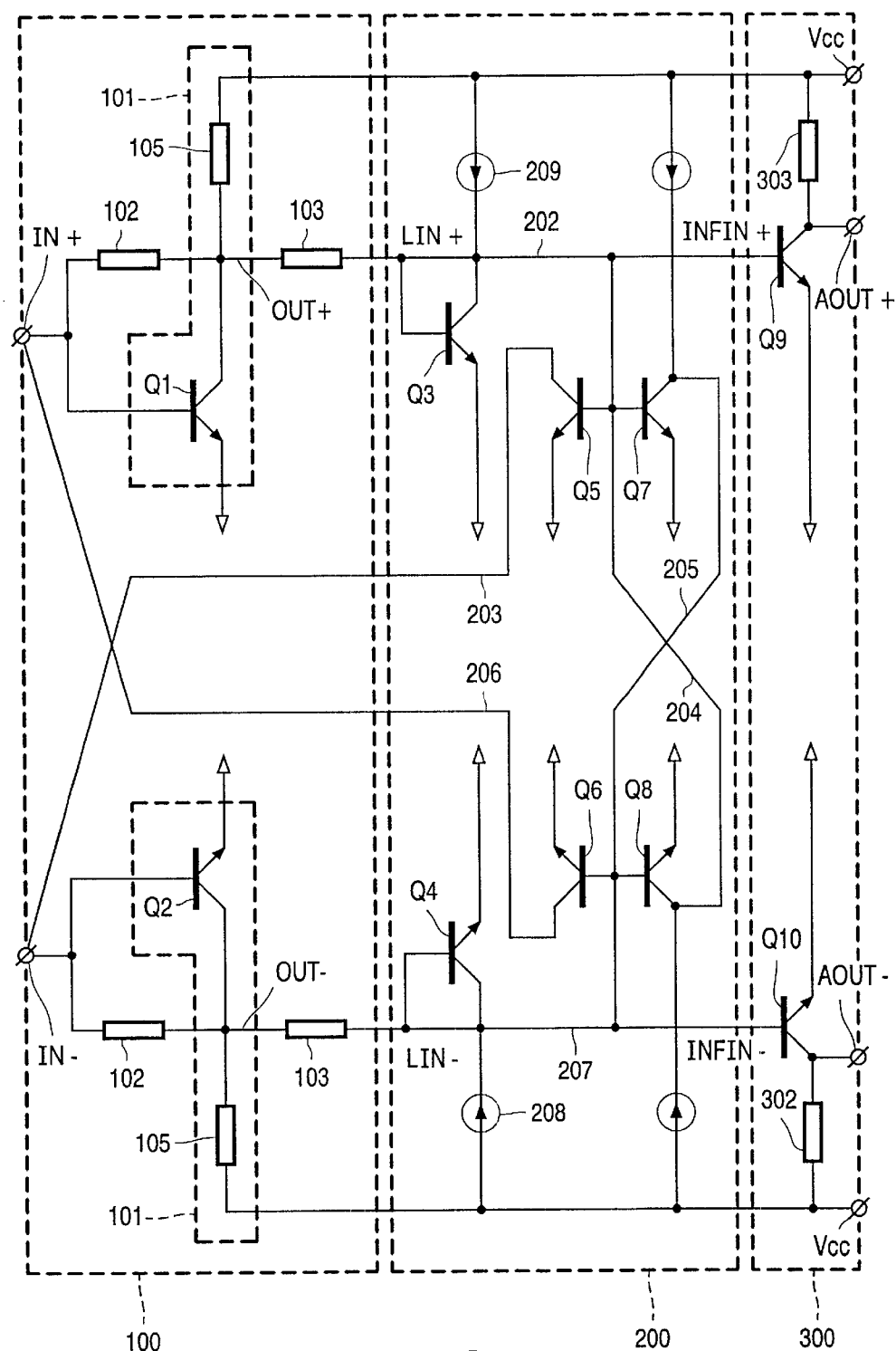
FIG. 5 shows a bipolar-CMOS implementation of the amplifier according to one embodiment of the present invention.

FIG. 5 shows a practical implementation of a fully differential, variable gain amplifier. By way of illustration bipolar and CMOS transistors are used. However, the circuit may alternatively be implemented in bipolar, CMOS or BiCMOS technology, or a combination thereof. For bipolar transistors, the control electrode, first main electrode and second main electrode correspond to the base, emitter and collector, respectively. For MOS transistors, the control electrode, first main electrode and second main electrode correspond to the gate, source and drain, respectively.

The three stages 100, 200 and 300 shown in FIG. 1 are indicated in dashed lines in FIG. 5.

Here the differential current-controlled voltage source shown in FIG. 2 is implemented by way of example, with two bipolar transistors Q1 and Q2 connected to a power supply Vcc via two resistors 105 and 106. If a total isolation from the power supply is desired, the two resistors 105 and 106 can be replaced by two current sources.

The negative feedback element 102 is illustrated as a resistor but it can be any wide band V-I converter. The V-I converter 103 is a simple resistor but any wide band V-I converter can be used instead.

The input stage 100 is presented as fully differential only for illustrative purposes, but if a single ended input signal source is connected between the input node IN+ and the reference node, the input node IN− can be used for the control of the off-set of the Amplifier.

The connection between the input stage 100 and the intermediate stage 200 is realized by the nodes LIN+ and LIN−. The two CCNs are realized by means of bipolar transistors Q3, Q4, Q5, Q6, Q7, Q8, by way of illustration. The two low impedance branches which couple the relatively low impedance nodes LIN+ and LIN− and the reference node, include two transistors Q3 and Q4 connected as diodes and are simply simply referred to as diodes Q3 and Q4 hereinafter. The diodes Q3 and Q4 are connected to the power supply Vcc via two current sources 209 and 208.

The negative feedback connections 203 and 206 are realized with two transistors Q5 and Q6. The transistors Q3 and Q5 and the current source 209 represent a current mirror and the negative feedback signal 203 is a current proportional to the current that flows through the diode Q3. Likewise, the transistors Q4 and Q6 and the current source 208 represent a current mirror and the negative feedback signal 206 is a current proportional to the current that flows through the diode Q4. In a possible practical realization the currents 203 and 206 can be replicas of the currents through the diodes Q4 and Q3.

Two transistors Q8 and Q7 generate the positive feedback signals 204 and 205. The transistor Q8 with the diode Q4 and the current source 208 represents a current mirror and the positive feedback signal 204 is a current proportional to the current through the diode Q4.

Likewise, the transistor Q7 with the diode Q3 and the current source 209 represent a current mirror and the positive feedback signal 205 is a current proportional to the current through the diode Q3.

In a possible practical realization the currents 204 and 205 can be replicas of the currents through the diodes Q4 and Q3.

The intermediate stage 200 provides negative feedback signals 203 and 206 to the input stage 100, which reduce the input impedance of the input stage 100 and, at the same time, enlarge its bandwidth.

The intermediate stage 200 provides positive feedback signals 204 and 205 to the common nodes LIN+ and LIN−, which improve the CMRR factor of the Amplifier and increase the S/N ratio of the circuit.

In an implementation of the intermediate stage 200 presented in FIG. 5 the common nodes LIN+ and LIN− coincide with the output nodes INFIN+ and INFIN−, which are the input nodes of the output stage 300.

The output stage 300 includes two CCVSs connected in a differential manner. By way of illustration the two CCVSs are realized with bipolar transistors Q9 and Q10, but any other wide band CCVSs can be used instead. There are two resistors 303 and 302 in the collectors of the transistors Q9 and Q10.

The transistor Q9, the diode Q3, the current source 209 and the resistor 303 form a current mirror and, as a consequence, the current through the resistor 303 is proportional to the current through the diode Q3.

Likewise, the transistor Q10, the diode Q4, the current source 208 and the resistor 302 form a current mirror and, as a consequence, the current through the resistor 302 is proportional to the current through the diode Q4.

Since the input nodes TNFIN+ and INFIN− are low impedance nodes the output stage has an enlarged bandwidth.

The overall gain of the Amplifier can be controlled by the value of the resistors 302 and 303, the gain of the Amplifier being adjustable independently of its bandwidth, which is controlled by the intermediate stage 200.

Figure 6:
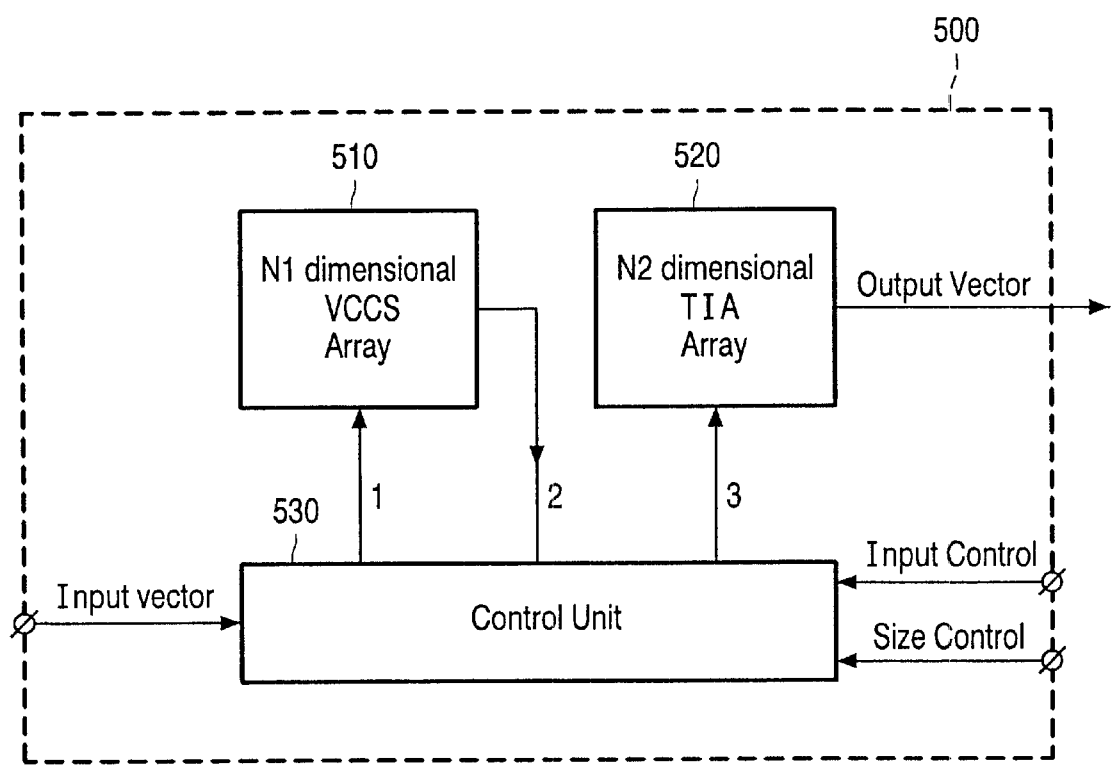
FIG. 6 shows a multidimensional amplifier arrangement.

An embodiment of a multidimensional amplifier arrangement 500 according to the invention is presented in FIG. 6. The multidimensional amplifier arrangement is characterized by a first, N1 dimensional array of Voltage Controlled Current Sources (VCCS array) 510, a second, N2 dimensional array of fully differential, variable gain amplifiers (TIA array) 520 as defined in claim 1, and a Control Unit 530, said Control Unit 530 being coupled to the VCCS and the TIA arrays.

Said Control Unit 530 can route an Input vector signal either to said VCCS Array 510 via a signal path 1 or to the TIA Array 520 via a signal path 3. There is also a signal path 2, which is the output vector of said VCCS Array 510.

If the Input vector is a vector of voltages, it is routed to the VCCS Array 510 via the signal path 1. The output signal of the VCCS array is then routed to the input of the TIA array by the Control Unit 530 via the signal path 2 and via the signal path 3.

If the Input vector is a vector of currents, it is routed to the TIA array by the Control Unit 530 via the signal path 3, the VCCS Array 510 being disconnected from the Input vector. If the Input vector comprises a mixture of voltage and current components, the voltage components are routed to the TIA array 520 via paths 1, 2 and 3 and the current components are routed via the path 3.

The Size Control path is a vector of control signals which control the dimension and the number of the elements of said VCCS Array, and said TIA Array. If, for example N1=N2=1 and only one VCCS and one TIA has been selected, a wide band Voltage Controlled Voltage Source is obtained. If N1=2 and N2=1 the arrangement may define a switching matrix for wide band signals. In this case the Size Control signals control which of the input VCCSs receives the signal and which of the TIAs provides the output signals. In this situation the circuit act, like a crossbar switch for high frequency signals.

It is to be noted that if the Input vector is not a vector of currents or a vector of voltages it can be routed either via the VCCS array or via the TIA array in accordance with the properties of the Input vector components. This is the case, for example, when the Input vector is a vector of charges.

Furthermore, the signal paths may be either hardwired or programmable with a computer program.

The Output Vector is a vector comprising the selected outputs of the fully differential, variable gain amplifiers of a preferred embodiment of the application by the Size Control signals.

It is to be noted that the scope of protection of the invention is not restricted to the embodiments described herein. Neither is the scope of protection of the invention restricted by the reference numerals in the claims. The use of the verb "to comprise" does not exclude the presence of any elements other than those defined in a claim. The use of the indefinite article "a(n)" preceding an element does not exclude the presence of a plurality of these elements. Means forming part of the invention may both be implemented in the form of dedicated hardware or in the form of a programmed general-purpose processor. The invention resides in any new feature or combination of features.

What is claimed is:

1. A fully differential, variable gain amplifier comprising an input stage, an intermediate stage, and an output stage, the input stage (100) being coupled to the intermediate stage (200) and the intermediate stage being coupled to the output stage (300), voltage to current conversion means (103) characterized in that the input stage comprises a differential input amplifier (101) having local feedback means (102) and the voltage to current conversion means, for coupling said input amplifier to the intermediate stage, the intermediate stage comprises a first and a second branch from respective common nodes (LIN+) and (LIN−) to a reference node, which common nodes are shared by said input, output and intermediate stages, the intermediate stage further comprises current controlled networks (201) coupled to the common nodes via first feedback branches and to the input stage via second feedback branches.

2. An amplifier as claimed in claim 1, characterized in that the first feedback branches comprise positive feedback means (204, 205) and the second feedback branches comprise negative feedback means (203, 206).

3. An amplifier as claimed in claim 1, characterized in that the local feedback means comprises negative feedback means (102).

4. An amplifier as claimed in claim 2, characterized in that the input stage (100) comprises current controlled voltage sources (101) with a local negative feedback (102), the intermediate stage comprises the positive and negative feedback means, for replicating a current that flows in the first and second branches to the input of the current controlled voltage source (101) and to the output stage (300).

5. An amplifier as claimed in claim 4, wherein the output stage comprises Current Controlled Voltage Sources.

6. A multidimensional amplifier arrangement (500) characterized by a first N1 dimensional array of Voltage Controlled Current Sources (VCCS array) (510), a second N2 dimensional array of fully differential, variable gain amplifiers (TIA array) (520) as claimed in claim 1, and a Control Unit (530), said Control Unit (530) being coupled to the VCCS and the TIA array.

7. A multidimensional arrangement (500) as claimed in claim 6, wherein the Control Unit (530) comprises means for controlling the size of the VCCS array (510) and/or the size of the TIA array (520) via a Size Control signal.

8. A multidimensional arrangement (500) as claimed in claim 7, wherein said Size Control Signal is a first vector of signals.

9. A multidimensional arrangement (500) as claimed in claim 6, wherein the said Control Unit (530) comprises means for controlling the route of an Input vector either to the VCCS Array (510) via a signal path 1 or to said TIA Array (520) via a signal path 3 under the control of an Input Control signal.

10. A multidimensional arrangement (500) as claimed in claim 9, wherein the Input Control signal is a second vector of signals.

11. An arrangement as claimed in claim 8, wherein, if the Input vector is a vector of voltages, the signal path 1 is the same for the Input vector and the signal path 3 is an output signal 2 generated by the VCCS array (510).

12. An arrangement as claimed in claim 9, wherein, if the said Input vector is a vector of currents, the signal vector 3 is the same as for the vector of currents and said VCCS array (520) is disconnected from the vector of currents.

13. An arrangement as claimed in claim 6, wherein the TIA array (520) comprises an Output Vector, said Output Vector being a third vector of signals comprising the outputs of the fully differential, variable gain amplifiers as claimed in claim 1.

* * * * *